(12) United States Patent
Doyle et al.

(10) Patent No.: US 7,521,775 B2
(45) Date of Patent: Apr. 21, 2009

(54) PROTECTION OF THREE DIMENSIONAL TRANSISTOR STRUCTURES DURING GATE STACK ETCH

(75) Inventors: Brian S. Doyle, Portland, OR (US); Uday Shah, Portland, OR (US); Been-Yih Jin, Lake Oswego, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 288 days.

(21) Appl. No.: 11/452,883

(22) Filed: Jun. 13, 2006

(65) Prior Publication Data
US 2007/0287255 A1 Dec. 13, 2007

(51) Int. Cl.
*H01L 29/06* (2006.01)

(52) U.S. Cl. .............. 257/618; 438/198; 257/E29.134

(58) Field of Classification Search ................ 257/401, 257/618, E29.111, E29.134; 438/198, 199
See application file for complete search history.

(56) References Cited

U.S. PATENT DOCUMENTS

| 7,005,366 | B2 | 2/2006 | Chau et al. | |
|---|---|---|---|---|
| 7,087,499 | B2* | 8/2006 | Rankin et al. | ................ 438/412 |
| 7,288,805 | B2* | 10/2007 | Anderson et al. | ............ 257/250 |
| 2005/0035415 | A1* | 2/2005 | Yeo et al. | ..................... 257/401 |
| 2005/0242406 | A1* | 11/2005 | Hareland et al. | ............ 257/401 |
| 2006/0275988 | A1* | 12/2006 | Yagishita et al. | ............ 438/275 |

* cited by examiner

*Primary Examiner*—W. David Coleman
(74) *Attorney, Agent, or Firm*—Kenneth A. Nelson

(57) ABSTRACT

Embodiments of the invention include apparatuses and methods relating to three dimensional transistors having high-k dielectrics and metal gates with fins protected by a hard mask layer on their top surface. In one embodiment, the hard mask layer includes an oxide.

23 Claims, 4 Drawing Sheets

PROTECTION OF THREE DIMENSIONAL TRANSISTOR STRUCTURES DURING GATE STACK ETCH

TECHNICAL FIELD

Embodiments of the invention relate to microelectronics processing technology. In particular, embodiments of the invention relate to microelectronic devices having three dimensional transistor structures.

BACKGROUND

In microelectronics products, transistors and other devices are typically fabricated and interconnected to form an integrated circuit. The performance of the integrated circuit is often directly related to the performance of the fabricated transistors. In some proposed processes, the transistors are three dimensional transistors having fins with two (dual or double gate transistors) or three (tri-gate transistors) channel surfaces in contact with the gate structure. Three dimensional transistors can be contrasted with planar transistors, which have one channel surface in contact with the gate structure. Due to the greater surface area of contact between the channel region and the gate structure, three dimensional transistors offer the potential for performance advantages over planar transistors.

Further, processing of transistors (three dimensional or planar) has traditionally involved the use of monocrystalline silicon for the channel material, silicon dioxide for the gate dielectric, and polysilicon for the gate electrode. However, the continued scaling to smaller and smaller transistors, along with a desire for increased performance, has driven the transition to high-k gate dielectrics (those having a dielectric constant, k, greater than that of silicon dioxide, i.e., greater than about 4), which offer greater capacitance and less leakage. The move to high-k gate dielectrics has also enabled new gate electrode materials, such as metal gate electrodes, to provide advantageous work function materials in the gate electrode.

In some processes, fabricating a three dimensional transistor includes forming a dielectric layer and an electrode layer over the transistor fin. The dielectric and electrode layers are then patterned and etched to expose portions of the fin. In such processes, etching the fins has numerous difficulties. For example, it may be difficult to remove all of the materials from the sidewalls of the fins, particularly with high-k dielectrics and metal electrodes. In some instances, etching the dielectric and electrode layers to expose the sidewalls of the fins can erode the fin causing non-operative devices and low yields.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to three dimensional transistors are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the implementation of three dimensional transistors, it may be desirable to etch regions of gate dielectric and gate electrode layers to expose portions of the transistor fin such that the sidewalls of the exposed fin are substantially clean of the dielectric and electrode materials. Substantially clean sidewalls are often required for subsequent processing, such as raised source/drain and silicide processing. In particular, for three dimensional transistors having high-k ("high-k" referring to materials having a dielectric constant, k, greater than that of silicon dioxide, or k greater than about 4) gate dielectrics and metal gate electrodes, etching the dielectric and electrode materials often requires harsh chemicals that damage the fin, which can cause device failures. Briefly, the present description provides structures and methods that enable etching transistor fins to remove the gate dielectric and electrode materials from the fin by providing an etch resistant hard mask layer on the fin.

FIGS. 1-11 illustrate methods and structures for fabricating three dimensional transistor fins having an etch resistant hard mask layer.

Figure 1A:
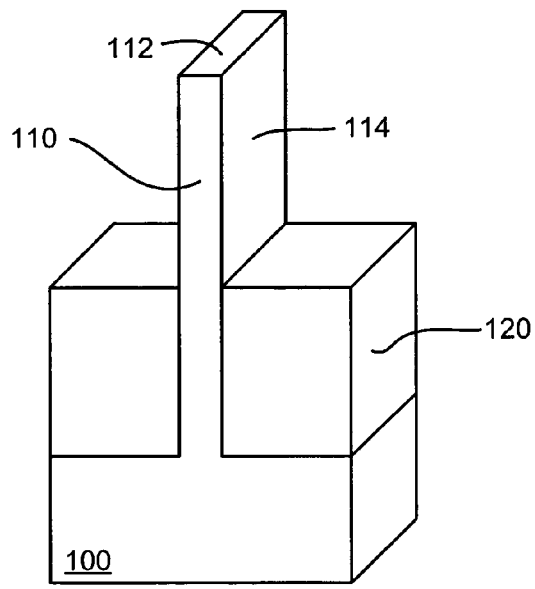
FIG. 1A is a perspective illustration of a three dimensional transistor fin and an insulator layer adjacent to the base of the fin disposed on a substrate.

FIG. 1A illustrates a fin 110 having a top surface 112 and side surfaces 114 (one side surface is labeled, the other is opposite the labeled surface and hidden in the perspective view), and an insulator 120 disposed on a substrate 100. Herein, the term "top surface" refers to the surface that is away from the substrate, such that the substrate is used as the frame of reference and subsequent structures are built "up" upon the substrate. Therefore, use of terms such as bottom, top, over, and side are with reference to the arbitrary reference of the substrate as being toward the bottom of the structure, and not referring to "up" or "down" in reference to the ground or any other frame of reference.

Fin 110 and insulator 120 are formed by known techniques. Fin 110 includes any suitable semiconductive material, such as silicon, and insulator 120 includes any suitable insulative material, such as an oxide.

As shown, fin 110 may be formed such that it is the same material as a top portion of substrate 100 and is continuous of substrate 100. Insulator 120 is then formed on substrate 100 and adjacent to a bottom portion of fin 110, leaving the top portion of the fin exposed and the fin extending above insulator 120. In another example, fin 110 is formed separately from substrate 100 and, in such cases, may be either the same material as substrate 100 or a different material. In such examples, the fin and the insulator are disposed on the substrate and, as in FIG. 1A, the insulator is adjacent to a bottom portion of the fin leaving the top portion of the fin exposed.

Figure 1B:
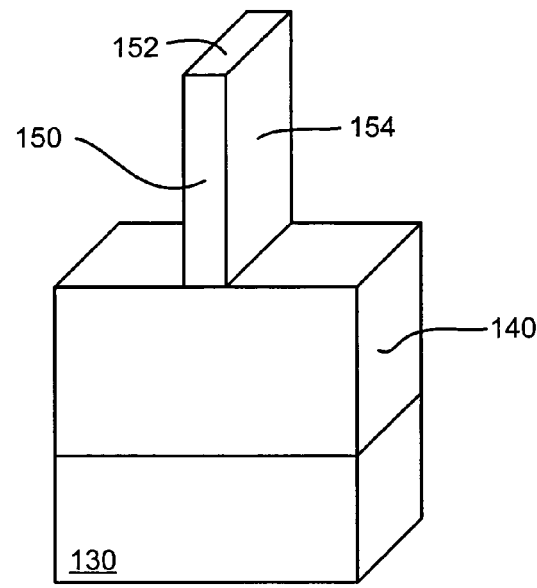
FIG. 1B is a perspective illustration of an insulator disposed on a substrate and a three dimensional transistor fin disposed on the insulator layer.

In yet another example, as shown in FIG. 1B, a fin 150 having top surface 152 and side surfaces 154 is disposed on an insulator layer 140, which is disposed on a substrate 130. Insulator 140 then extends entirely under fin 150 such that no portion of insulator 140 is adjacent to side surfaces 154. Such an arrangement may be formed from a silicon-on-insulator (SOI) substrate, for example. SOI substrates include an insulator layer, such as an oxide, on a bulk substrate material and a silicon layer on the insulator layer. A fin is then formed by patterning and etching the silicon layer of the SOI substrate, leaving an arrangement as in FIG. 1B. Any of the described arrangements may be used in the methods that are discussed below with reference to the figures. For the purpose of illustration, the arrangement of FIG. 1A is used in FIGS. 2-11.

Figure 2:
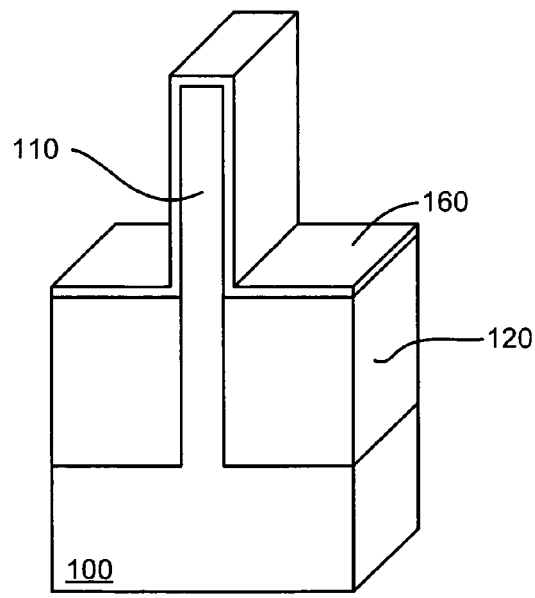
FIG. 2 illustrates the structure of FIG. 1A with a layer disposed over the fin and the insulator layer.

As illustrated in FIG. 2, a layer 160 is formed over fin 110 and insulator 120. Layer 160 is formed as a conformal layer over the insulator, the side surfaces of fin 110, and the top surface of fin 110. Layer 160 includes any suitable material that can protect fin 110 from the formation of a hard mask layer on the fin, as is further described with reference to FIG. 5 below. In one example, layer 160 includes a nitride, such as a silicon nitride material. Layer 160 is formed by any suitable technique, such as atomic layer deposition, physical vapor deposition, or the like.

Figure 3:
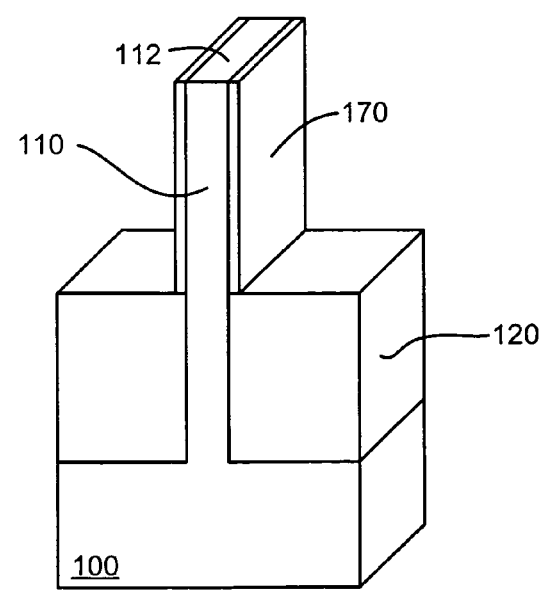
FIG. 3 illustrates the structure of FIG. 2 with portions of the layer removed to form sidewall spacers adjacent to the fin.

As illustrated in FIG. 3, portions of layer 160 are removed to form sidewall spacers 170 and to expose top surface 112 of fin 110. As shown, sidewall spacers 170 are adjacent to and cover at least part of the side surfaces of fin 110 while exposing the top surface of the fin. Sidewall spacers 170 are formed from the conformal layer by any suitable technique, such as an anisotropic etch technique. As shown, the removal of the conformal layer from the top of fin 110 may also remove the conformal layer from a top portion of insulator 120.

Figure 4:
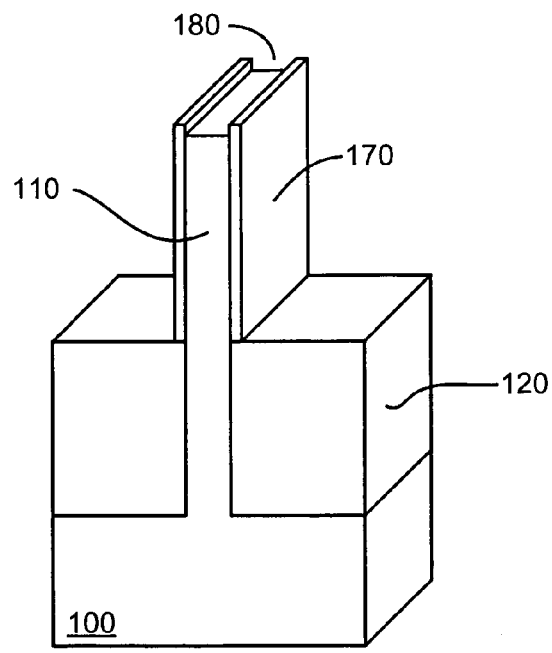
FIG. 4 illustrates the structure of FIG. 3 with a portion of the top of the fin removed to recess it below the sidewall spacers.

As illustrated in FIG. 4, a recess etch may be performed to remove a portion of fin 110 to leave a recess region 180. The recess etch is performed by any suitable technique, such as a wet etch or a dry etch technique. Providing recess region 180 offers the advantage of preventing mushrooming of the subsequently formed hard mask by surrounding the edges of the top surface of fin 110 with sidewall spacer material. However, in another example, the recess etch is not necessary to form a suitable hard mask layer on fin 110 and is not performed. Therefore, the recess etch is an optional processing step.

Figure 5:
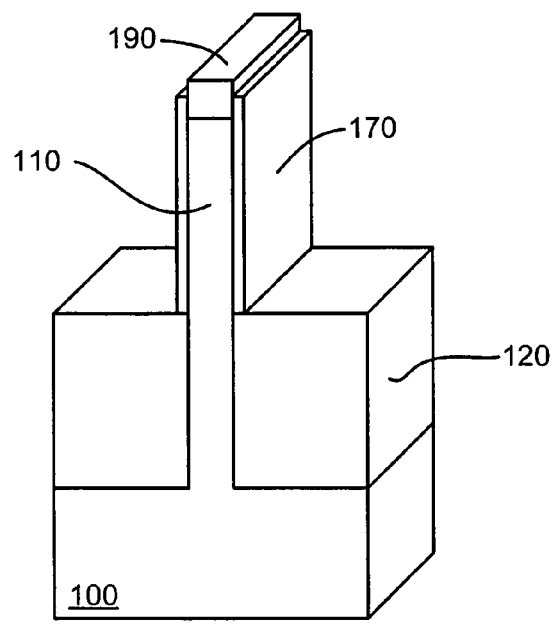
FIG. 5 illustrates the structure of FIG. 4 with a hard mask layer disposed on the top surface of the fin.

As illustrated in FIG. 5, a hard mask layer 190 is formed on the top surface of fin 110 while sidewall spacers 170 protect the side surfaces of the fin from a hard mask forming thereon. Hard mask layer 190 includes any suitable material that protects fin 110 during the subsequent etch processing that removes portions of gate dielectric materials and gate electrode materials, as is further discussed below. In one embodiment, hard mask layer 190 is an oxide that is formed by any suitable technique, such as a thermal oxide growth.

Figure 6:
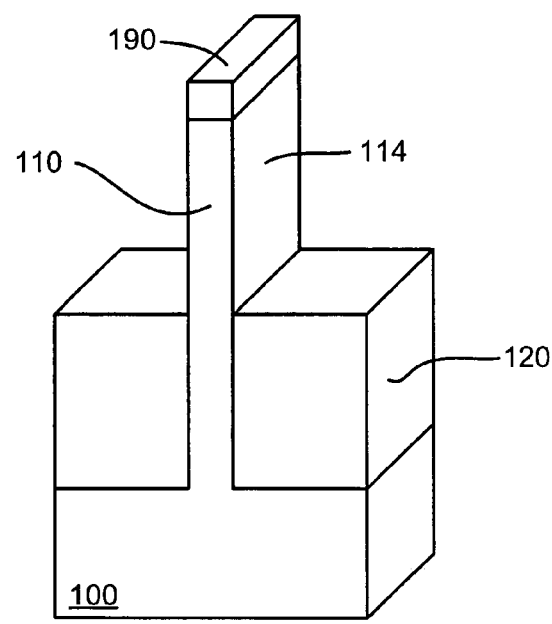
FIG. 6 illustrates the structure of FIG. 5 with the sidewall spacers removed.

As illustrated in FIG. 6, the sidewall spacers are removed. The sidewall spacers are removed by any suitable technique, such as wet etch or dry etch techniques. In examples where the sidewall spacers include nitride materials, the sidewall spacers may be removed by a phosphoric acid wet etch ("hot phos") processing technique.

The structure of FIG. 6 provides fin 110 having a hard mask layer 190 on its top surface while leaving side surfaces 114 exposed. Hard mask layer 190 therefore protects the entire exposed fin in top down anisotropic etch processing and protects the top surface and top edges of the fin, which are particularly susceptible to etch erosion, in non-directional etch processing.

Figure 7:
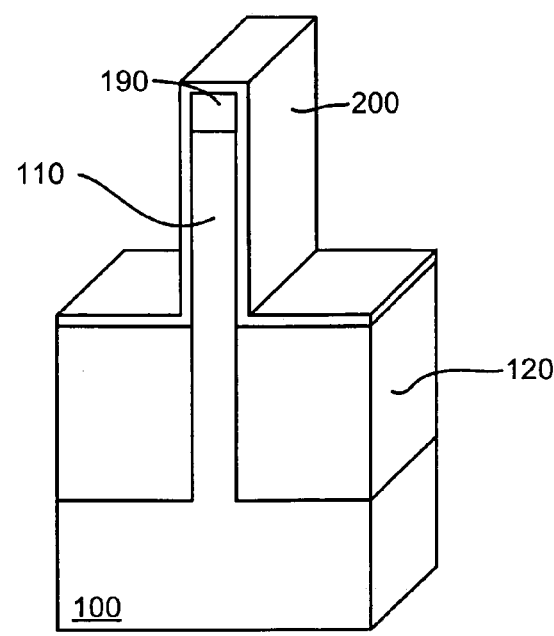
FIG. 7 illustrates the structure of FIG. 6 with a gate dielectric layer disposed on the fin and the insulator layer.

As illustrated in FIG. 7, a gate dielectric layer 200 is formed over fin 110, hard mask layer 190, and insulator 120. Gate dielectric layer 200 includes any suitable gate dielectric material, such as silicon dioxide or high-k dielectric materials such as hafnium oxide, zirconium oxide, hafnium silicate, hafnium oxy-nitride, or lanthanum oxide. Gate dielectric layer 200 is formed by any suitable technique, such as chemical vapor deposition or atomic layer deposition. Gate dielectric layer 200 is formed as a conformal layer over the entirety of the illustrated structure.

Figure 8:
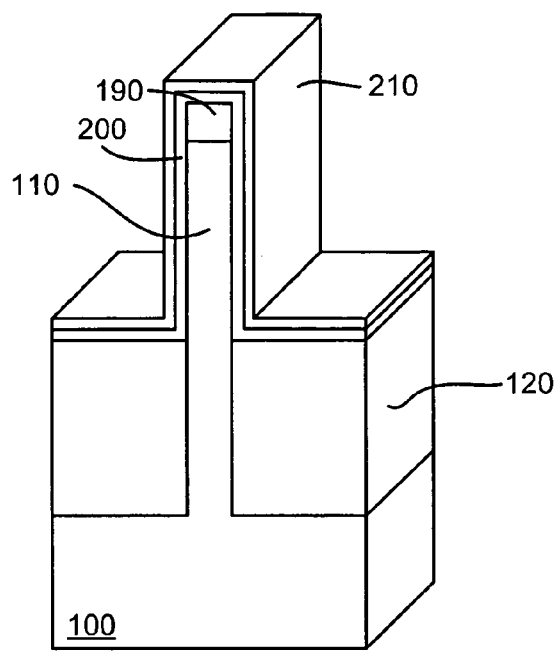
FIG. 8 illustrates the structure of FIG. 7 with a first gate electrode layer disposed on the gate dielectric layer.

As illustrated in FIG. 8, a gate electrode layer 210 is optionally formed over gate dielectric layer 200. Gate electrode layer 210 includes any suitable gate material, including metal gate materials such as metal nitrides, metal carbides, hafnium, zirconium, titanium, tantalum, aluminum, ruthenium, palladium, platinum, cobalt, nickel or conductive metal oxides, e.g. ruthenium oxide. Gate electrode layer 210 is formed by any suitable technique, such as deposition techniques. As shown, in one embodiment, the gate electrode layer is a thin conformal layer over the gate dielectric. In another embodiment, as is further discussed below, the gate electrode layer includes a thick layer where the entire top surface of the gate electrode layer is over the top of the fin. In such an embodiment, the second gate electrode material as shown in FIG. 9 is not required.

Figure 9:
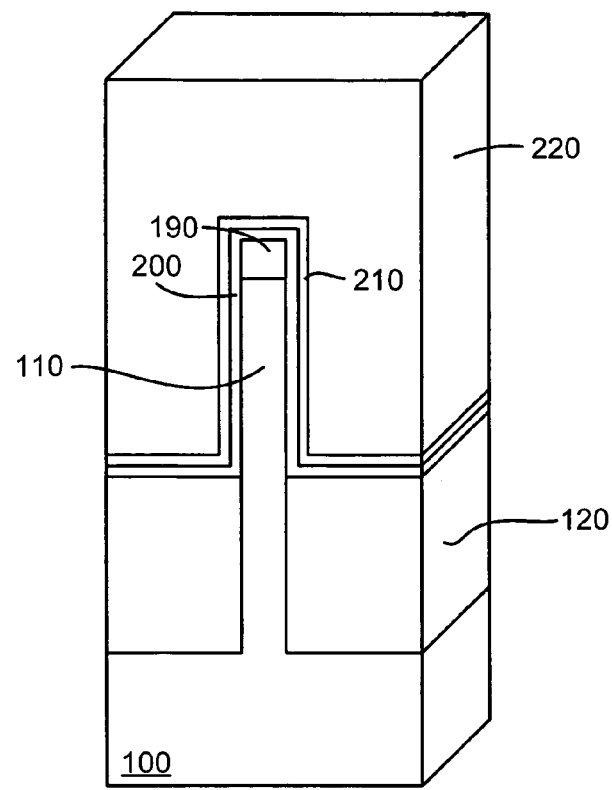
FIG. 9 illustrates the structure of FIG. 8 with a second gate electrode layer disposed on the first gate electrode layer.

As illustrated in FIG. 9, a bulk gate electrode layer 220 is optionally formed over gate electrode layer 210. Bulk gate electrode layer 220 is any suitable conductive material that provides a gate structure for a transistor, such as polysilicon. In the illustrated embodiment, a thin electrode layer 210 and a bulk gate electrode material are used. The thin electrode layer may provide a material having an appropriate work function for the formation of the transistor's gate electrode structure. The required work function material typically only needs to be thick enough to provide the work function in close proximity to the dielectric layer. Therefore, a thin work function material and a different thick electrode material may be used. This combination of thin gate electrode work function material and thick bulk electrode material offers the advantages of limiting the amount of metal gate material that must subsequently be etched and providing a material with well understood properties (e.g., polysilicon) for the bulk of the gate electrode.

In another embodiment, however, the material of gate electrode layer 210, having the appropriate work function, is formed such that it is substantially thick so as to eliminate the need for a second gate electrode material. In such an embodiment, the work function material is formed such that the entire top surface of the work function material is over the fin similarly to the top surface of the bulk gate electrode material illustrated in FIG. 9.

Figure 10:
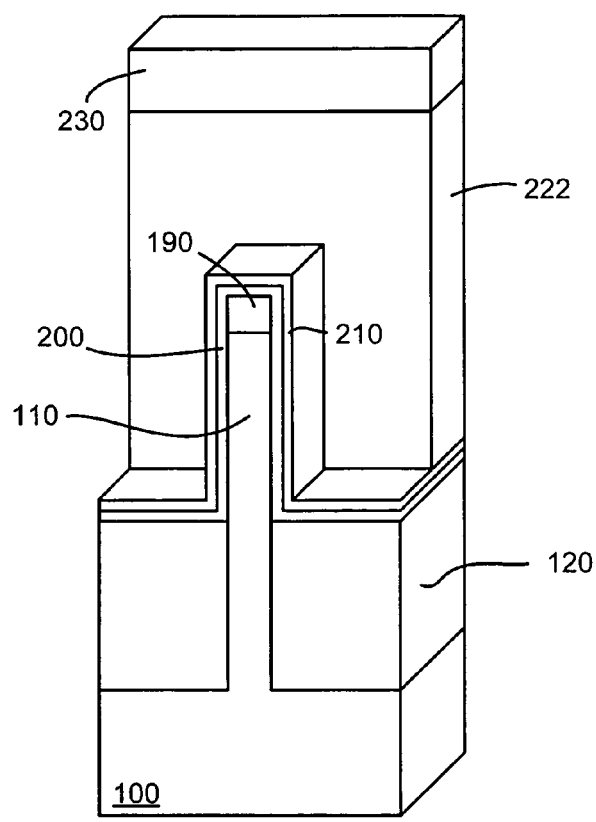
FIG. 10 illustrates the structure of FIG. 9 with a pattern layer disposed on part of the second gate electrode layer, and the exposed portion of the second gate electrode layer removed.
Figure 11:
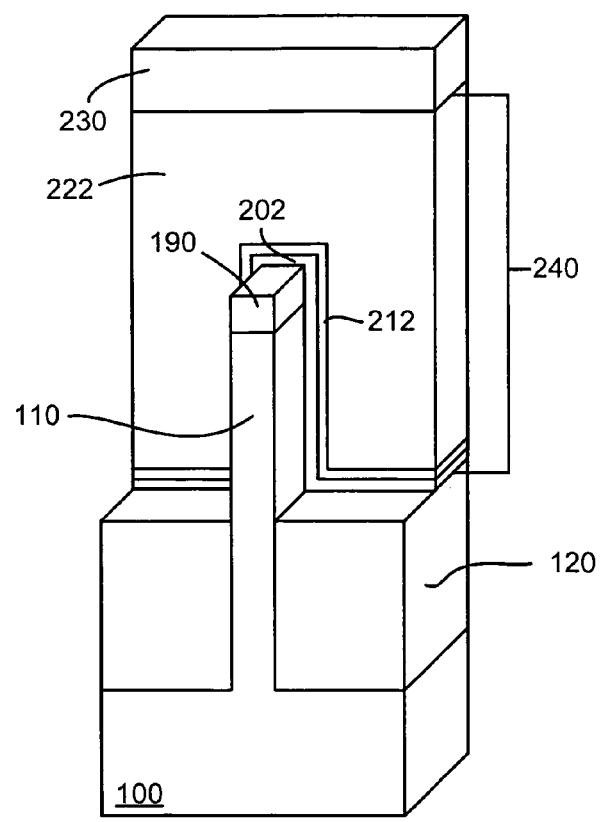
FIG. 11 illustrates the structure of FIG. 10 with the exposed portions of the first gate electrode layer and the gate dielectric removed.

The method continues with either of the described embodiments. In FIGS. 10 and 11, the structure of FIG. 9 is used for purposes of illustration. As illustrated in FIG. 10, a pattern 230 is formed over the bulk gate electrode layer and the exposed portions of bulk gate electrode layer are removed to form a patterned bulk gate electrode layer 222. Pattern 230 is formed by known techniques, such as lithography and etch techniques, and includes any suitable material that provides a mask for removal of the underlying layers. For example, pattern layer 230 may include a resist or a hard mask material. The bulk gate electrode layer is removed by any suitable technique, such as etch processing. Of course, in embodiments where a second bulk gate electrode material is not used, pattern 230 is formed directly on the thick work function gate electrode material.

As illustrated in FIG. 11, exposed portions of the gate electrode layer and the gate dielectric layer are etched to form patterned gate electrode layer 212 and patterned dielectric layer 202. Patterned dielectric layer 202, patterned gate electrode layer 212, and patterned bulk gate electrode layer 222 (or, alternatively, a patterned thick work function gate electrode and a patterned dielectric layer) make up a gate structure 240. Further, patterned dielectric layer 202, patterned gate electrode layer 212, and patterned bulk gate electrode layer 222 cover a portion of fin 110 such that the covered portion of the fin includes the channel region of the transistor structure.

As discussed, hard mask layer 190 protects fin 110 during the etch processing. Therefore, an aggressive etch may be utilized that substantially cleans the sidewalls of the fin without substantially eroding or damaging the fin. The etch processing includes dry etch techniques, wet etch techniques, or a combination of wet and dry etching techniques, depending on the materials of the gate electrode layer and the gate dielectric layer. As shown, a portion of hard mask layer 190 is on fin 110 and covered by gate structure 240 while another portion of hard mask layer 190 is on fin 110 and exposed. In subsequent processing, the portion of fin 110 that is exposed may be removed by suitable techniques, such as etch techniques. The structure of FIG. 11 and the alternative described embodiments may then be used to fabricate fully formed transistors by any variety of known methods.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
   a transistor fin having a top surface and at least two sidewall surfaces, wherein the transistor fin includes a channel region;
   an oxide layer on at least the portion of the top surface of the transistor fin that is over the channel region of the transistor fin;
   a high-k gate dielectric layer over the channel region of the transistor fin and the oxide layer but not over at least a different portion of the transistor fin, leaving the different portion of the transistor fin exposed; and
   a metal gate electrode over the high-k gate dielectric.

2. The apparatus of claim 1, further comprising:
   a polysilicon layer over the metal gate electrode.

3. The apparatus of claim 1, wherein the high-k gate dielectric comprises at least one of hafnium oxide, zirconium oxide, hafnium silicate, hafnium oxy-nitride, or lanthanum oxide.

4. The apparatus of claim 1, wherein the metal gate electrode comprises at least one of a metal nitride, a metal carbide, hafnium, zirconium, titanium, tantalum, aluminum, ruthenium, palladium, platinum, cobalt, nickel or a conductive metal oxide.

5. The apparatus of claim 1, wherein the oxide layer extends along the entire top surface of the transistor fin.

6. The apparatus of claim 1, wherein the transistor fin is on the insulator layer of a silicon-on-insulator substrate.

7. The apparatus of claim 1, wherein the metal gate electrode has a top surface that is entirely above the top surface of the transistor fin.

8. A method comprising:
   forming a transistor fin having a top surface and at least two sidewall surfaces;
   forming an oxide hard mask layer on only the top surface of the transistor fin;
   forming a gate dielectric layer over the transistor fin and the oxide hard mask layer;
   forming a metal gate electrode layer over the gate dielectric layer; and
   etching a portion of the metal gate electrode layer and the gate dielectric layer to expose a region of the transistor fin and the oxide hard mask layer.

9. The method of claim 8, wherein forming the oxide hard mask layer on only the top surface of the transistor fin comprises:
   forming sidewall spacers adjacent to at least a portion of the sidewalls of the transistor fin;
   oxidizing only the top surface of the transistor fin to form the oxide layer; and
   removing the sidewall spacers.

10. The method of claim 8, wherein the gate dielectric layer comprises a high-k gate dielectric material.

11. The method of claim 8, wherein the metal gate electrode layer comprises at least one of a metal nitride, a metal carbide, hafnium, zirconium, titanium, tantalum, aluminum, ruthenium, palladium, platinum, cobalt nickel or a conductive metal oxide.

12. The method of claim 8, wherein forming the transistor fin comprises patterning and etching a silicon layer of a silicon-on insulator substrate.

13. The method of claim 9, wherein forming the sidewall spacers comprises:
   forming a conformal nitride layer over the transistor fin; and
   anisotropically etching the conformal nitride layer to remove the nitride layer from the top surface of the transistor fin.

14. The method of claim 10, wherein the high-k gate dielectric material comprises at least one of hafnium oxide, zirconium oxide, hafnium silicate, hafnium oxy-nitride, or lanthanum oxide.

15. A method comprising:
forming a transistor fin having a top surface and at least two sidewall surfaces;
forming a conformal layer over the transistor fin;
etching the conformal layer to form sidewall spacers adjacent to at least part of the sidewall surfaces of the transistor fin;
forming a hard mask layer on only the top surface of the transistor fin after forming the sidewall spacers;
removing the sidewall spacers after forming the hard mask layer;
forming a gate dielectric layer over the transistor fin and the hard mask layer;
forming a gate electrode layer over the gate dielectric layer; and
etching a portion of the gate electrode layer and the gate dielectric layer to expose a region of transistor fin.

16. The method of claim 15, wherein the sidewall spacers prevent the hard mask layer from forming on the sidewall surfaces of the transistor fin during forming the hard mask layer.

17. The method of claim 15, wherein the gate dielectric layer comprises a high-k gate dielectric material.

18. The method of claim 15, wherein the gate electrode layer comprises a metal.

19. The method of claim 15, wherein the sidewall spacers comprise a nitride material.

20. The method of claim 15, wherein the transistor fin comprises silicon and the hard mask layer comprises an oxide.

21. The method of claim 15, further comprising:
removing a portion of the top of the transistor fin after forming the sidewall spacers to recess the top surface of the transistor fin below the sidewall spacers.

22. The method of claim 15, further comprising:
forming a polysilicon layer over the metal gate electrode layer; and
etching a portion of the polysilicon layer to expose the portion of the gate electrode layer.

23. The method of claim 18, wherein the gate electrode layer comprises at least one of a metal nitride, a metal carbide, hafnium, zirconium, titanium, tantalum, aluminum, ruthenium, palladium, platinum, cobalt, nickel or a conductive metal oxide.

* * * * *